(12) United States Patent
Takamatsu et al.

(10) Patent No.: US 6,207,117 B1
(45) Date of Patent: Mar. 27, 2001

(54) CHARGED PARTICLE BEAM APPARATUS AND GAS SUPPLY AND EXHAUSTION METHOD EMPLOYED IN THE APPARATUS

(75) Inventors: Jun Takamatsu, Yokohama; Munehiro Ogasawara, Fujisawa, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/150,704

(22) Filed: Sep. 10, 1998

(30) Foreign Application Priority Data

Sep. 18, 1997 (JP) .................................... 9-253297
Mar. 26, 1998 (JP) ................................. 10-078931

(51) Int. Cl.[7] ............................. B01J 23/42; B01J 23/44; H01J 37/20
(52) U.S. Cl. ...................... 422/186; 250/492.2; 250/398; 250/441.11
(58) Field of Search ........................... 250/441.11, 492.2, 250/398; 204/157.44, 157.47, 157.63; 422/186.04

(56) References Cited

U.S. PATENT DOCUMENTS 5,491,120 * 2/1996 Voss et al. ............................. 502/304
5,539,211    7/1996 Ohtoshi et al. .................. 250/441.11

FOREIGN PATENT DOCUMENTS 9-139184    5/1997 (JP) .

* cited by examiner

Primary Examiner—Bruce C. Anderson
Assistant Examiner—Nikita Wells
(74) Attorney, Agent, or Firm—Finnegan, Henderson, Farabow, Garrett & Dunner, L.L.P.

(57) ABSTRACT

An adsorption plate formed of a carrier and a precious metal catalyst carried by the carrier is provided at that portion of at least one of a beam column and a sample chamber incorporated in a charged-particle beam apparatus, in which carbon compounds may be generated. Further, a precious metal catalyst is provided on each deflector electrode contained in the beam column.

23 Claims, 6 Drawing Sheets

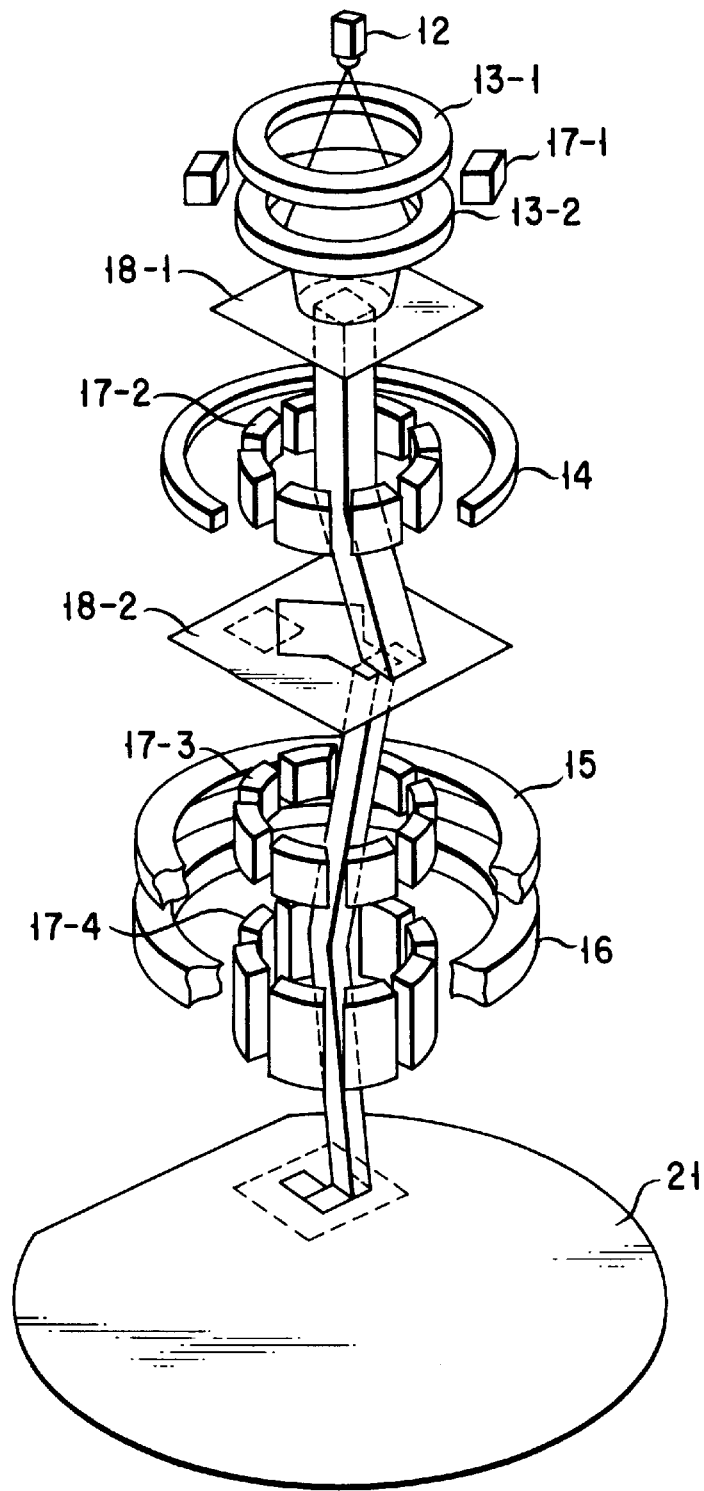
F I G. 2

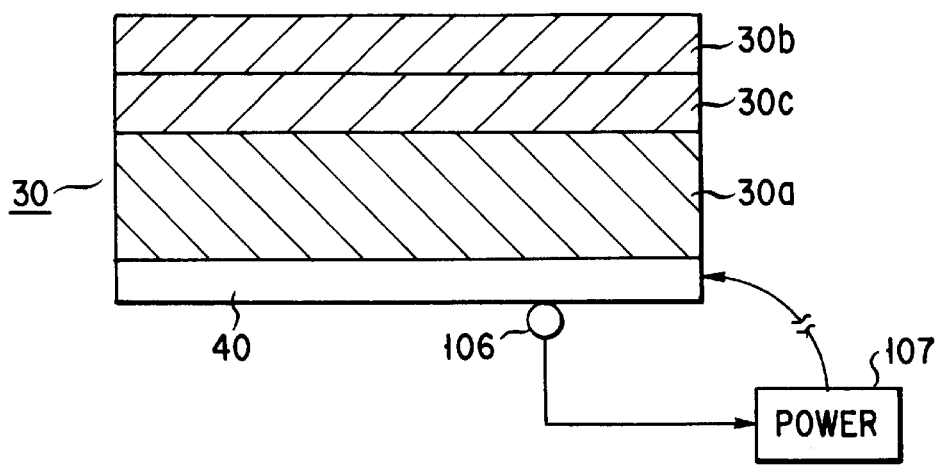
F I G. 5
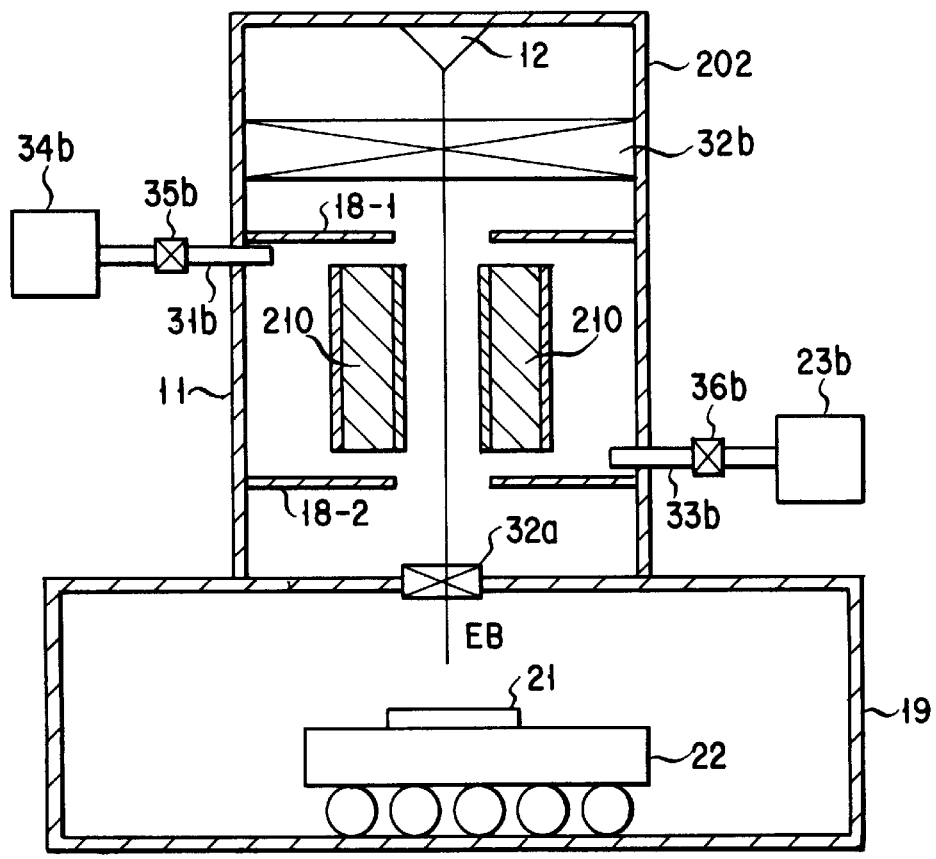
F I G. 6

CHARGED PARTICLE BEAM APPARATUS AND GAS SUPPLY AND EXHAUSTION METHOD EMPLOYED IN THE APPARATUS

BACKGROUND OF THE INVENTION

This invention relates to a charged particle beam apparatus, such as an electron beam exposure apparatus, used for drawing or transcribing a pattern on a substrate, and more particularly to a charged particle beam apparatus capable of reducing the amount of carbon compounds and a gas supply/exhaustion method employed therein.

In accordance with the development of integration of LSI devices, there are now strict demands for lithography apparatuses to have a higher precision and throughput. At the present stage, electron beam exposure apparatuses used as lithography apparatuses include drawing apparatuses using reticles (masks) and apparatuses for directly drawing patterns on wafers. To secure a sufficient throughput, these apparatuses employ a variable shaped beam (VSB) method or a character projection (CP) method as an exposure method.

When a pattern is drawn by such an electron beam exposure apparatus, beam drift is exemplified as a cause of degrading the drawing precision. How the drawing precision is degraded by the beam drift will be described using a shaping deflector as an example.

As shown FIG. 2, the shaping deflector is arranged between a first shaping aperture and a second shaping aperture. A deflector plate incorporated in the shaping deflector is made of, for example, Au, Pt, or Al coated with an Au thin film. These materials are used because it is important to keep the deflector plate surface stable. The shaping deflector controls a beam so that an image having passed through the first shaping aperture can be projected onto a predetermined portion of the second shaping aperture. The cause of occurrence of beam drift in the shaping deflector lies in the fact that the image having passed through the first shaping aperture will not be able to be projected onto the predetermined portion of the second shaping aperture with the lapse of time. The beam drift which occurs in the shaping deflector will be referred to as "shaping beam drift".

When shaping beam drift has occurred, the shape and size of the shaping beam will vary with the lapse of time. Accordingly, a shaping beam image of a desired shape and size will not be able to be obtained with the lapse of time, thereby degrading the precision of a drawn pattern.

Moreover, such beam drift may also occur in a deflector for positioning a beam on a desired portion of a sample.

The beam drift is mainly caused by an increase in the charge of substances which is accumulated on deflector electrodes incorporated in the deflector, or on components contained in a beam column near the deflector electrodes. Where non-conductive substances exist near the beam path, they are charged up when radiated with a beam, thereby changing the path of the beam. These non-conductive substances whose charge will increase due to the beam radiation are mainly carbon compounds.

Accumulation of the carbon compounds will appear when residual gases of carbon compounds adsorbed on surface portions of components in the beam column are excited and decomposed by low energy electrons such as secondary electrons.

Part of the residual gases of the carbon compounds consists of a gas which remains in the beam column even after exhaustion of the barrel. Further, a greater part of the residual gases consists of the gas of a carbon compound (mainly as the material of a solvent of a resist) which evaporates from the resist during exposure. This gas is generated whenever the exposure is performed. Accordingly, a great amount of carbon compounds is accumulated upon the components such as the deflector electrodes of the deflector contained in the beam column, thereby causing beam drift and hence serious degradation of drawing accuracy.

BRIEF SUMMARY OF THE INVENTION

It is the object of the invention to provide a charged-particle beam apparatus of a high and reliable drawing accuracy, and a method of supplying an oxidizing gas to the apparatus and exhausting the gas therefrom.

To attain the object, the invention provides a charged-particle beam apparatus comprising:

a beam apparatus main body including: a beam column having a beam source section which contains a beam source for generating a charged-particle beam, and a beam column main body having a deflector electrode section for deflecting the beam generated from the beam source; and a sample chamber connected to the beam column and containing a sample to be radiated with the beam deflected by the deflector electrode section of the beam column; and a catalyst member provided in the at least one of the beam column and the sample chamber, in which carbon compounds are generated, the catalytic material accelerating decomposition of the carbon compounds by oxidation.

Further, in a beam apparatus main body including: a beam column having a beam source section which contains a beam source for generating a charged-particle beam, and a beam column main body having a deflector electrode section for deflecting the beam generated from the beam source; and a sample chamber connected to the beam column and containing a sample to be radiated with the beam deflected by the deflector electrode section of the beam column;

the deflector electrodes each have a precious metal catalyst.

According to another aspect of the invention, there is provided a method of supplying an oxidizing gas into and exhausting the gas from a charged-particle beam apparatus including: a beam column having a beam source section which contains a beam source for generating a charged-particle beam, and a deflector electrode section for deflecting the beam generated from the beam source; a sample chamber connected to the beam column and containing a sample to be radiated with the beam deflected by the deflector electrode section of the beam column; and a catalyst member provided in the at least one of the beam column and the sample chamber, in which carbon compounds are generated, the catalytic material accelerating decomposition of the carbon compounds by oxidation, comprising the steps of:

supplying an oxidizing gas into at least one of the beam column and the sample chamber, with the beam source section isolated from the beam column; and exhausting the oxidizing gas from the at least of the beam column and the sample chamber.

In general, precious metals such as platinum and elements of the platinum group are known as catalysts for accelerating decomposition of carbon compound gases by oxidation. For example, a substance consisting of platinum fine particles called "platinum black" or porous platinum called "platinum sponge" have large effective surface areas, and hence can adsorb a great amount of carbon compound gases. Then, the porous platinum serves as a catalyst to accelerate decomposition-by-oxidation of the adsorbed carbon compound gases, whereby the carbon compound gases are quickly converted into water and, for example, $CO_2$.

As stated above, a porous or granular precious metal catalyst (e.g. platinum) is contained in the sample chamber to effectively adsorb a carbon compound gas generated from a resist during exposure, then to accelerate, by its catalytic function, decomposition of the carbon compound using an oxidizing substance (oxygen, ozone, etc.). The products resulting from the decomposition are exhausted to the outside of the apparatus by vacuum exhaustion. As a result, the amount of the carbon compound flowing into the beam column can be significantly reduced.

Moreover, the deflector electrodes of the beam column can be formed to contain a granular or porous precious metal catalyst (e.g. platinum). This catalyst adsorbs a carbon compound gas generated from a resist during exposure and contaminating the surfaces of the electrodes, and accelerates, by its catalytic function, decomposition-by-oxidation of the carbon compound. The products resulting from the decomposition are exhausted to the outside of the apparatus by vacuum exhaustion.

The above-described structure prevents accumulation of carbon compounds on, for example, the deflector electrodes of a deflector, thereby suppressing a beam drift caused by charge-up of the accumulated carbon compounds. As a result, drawing of a high accuracy can be performed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a perspective view, showing an essential part of the apparatus of FIG. 1;

FIG. 5 is a view, useful in explaining the structure of a precious-metal catalyst adsorption plate according to the invention and using an oxygen occluded substance as an auxiliary catalyst;

FIG. 6 is a sectional view, showing an electron beam exposure apparatus according to a second embodiment of the invention;

DETAILED DESCRIPTION OF THE INVENTION

A first embodiment of the invention will be described in detail with reference to drawings related thereto.

Figure 1:
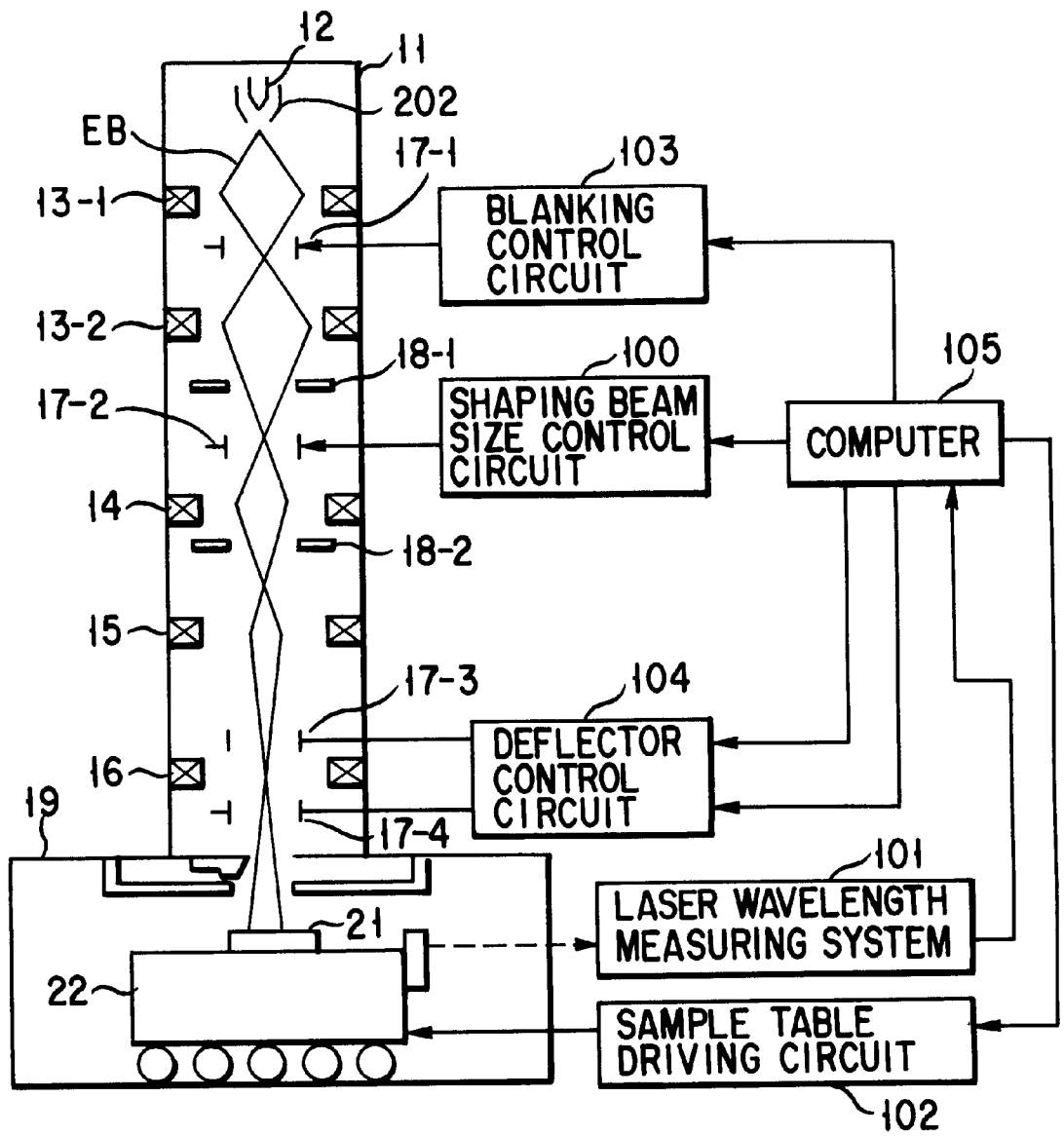
FIG. 1 is a sectional view, showing an electron beam exposure apparatus of a variable shaped beam system according to a first embodiment of the invention.

FIG. 1 shows an electron beam exposure apparatus of a VSB system, which comprises a beam column 11 and a sample chamber 19. The beam column 11 generally comprises an electron gun chamber 202 as a beam source which contains an electron gun 12. Further, the barrel 11 has a deflector electrode section for deflecting a beam emitted from the beam source. In this embodiment, the deflector electrode section includes condenser lenses, apertures, blanking electrodes, deflectors, etc.

In the above-described apparatus, an electron beam (EB) emitted from the electron gun 12 passes condenser lenses 13-1, 13-2 and reaches a first shaping aperture 18-1. The first shaping aperture 18-1 is in the shape of, for example, a rectangle of 100 $\mu$m. Accordingly, the electron beam having passed the first shaping aperture 18-1 is shaped 100 $\mu$m.

The shaped electron beam is projected onto a second shaping aperture 18-2 via a projection lens 14. An example of the second shaping aperture 18-2 has a shape of an arrow which is obtained by attaching a rectangle with one side of 100 $\mu$m to a rectangle with one side of 141 $\mu$m rotated by 45° with respect to the former. A shaping deflector 17-3 is provided upstream of the second shaping aperture 18-2. The advance direction of the electron beam can be changed by applying a predetermined voltage from a shaping-beam-size control circuit 100 to the second shaping deflector 17-2, thereby changing the position of an image, formed by the first shaping aperture, on the second shaping aperture 18-2.

The thus-changed projection position changes the manner of overlapping between the images, formed by the first shaping aperture 18-1, and the second shaping aperture 18-2. As a result, rectangular or triangular beam spots of different sizes can be formed. The rectangularly or triangularly shaped beam is reduced by a reduction lens 15, then passed through an objective lens 16, and positioned by a sub deflector 17-3 and a main deflector 17-4 which are controlled by a deflector control circuit 104. As a result, the beam reaches a predetermined portion of a sample 21 placed on a sample stage 22 in the sample chamber 19.

Further, the electron beam (EB) is switched on and off by a blanking electrode 17-1 which is controlled by a blanking electrode control circuit 103. The sample stage 22 is controlled by a laser wavelength measuring system 101 and a sample stage driving circuit 102. A computer 105 receives data indicative of measurement results, and imparts predetermined instructions to the blanking electrode control circuit 103, the shaping beam size control circuit 100, the deflector control circuit 104 and the sample stage driving circuit 102.

Figure 3:
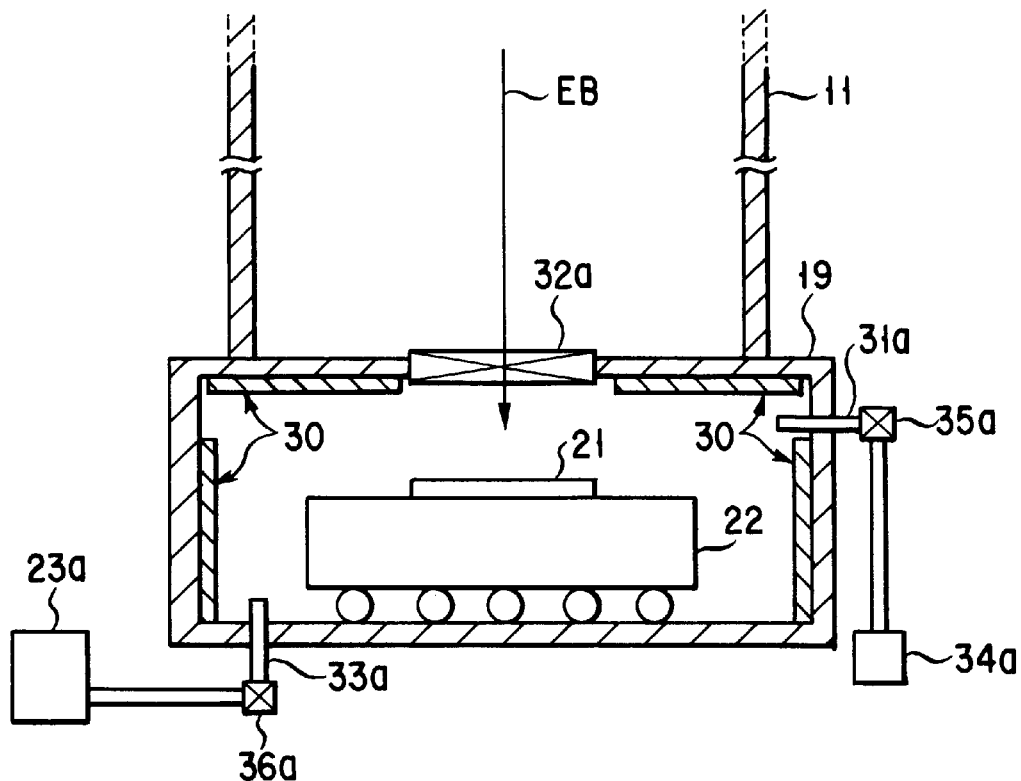
FIG. 3 is a sectional view, showing an essential part of the apparatus of FIG. 1.
Figure 4:
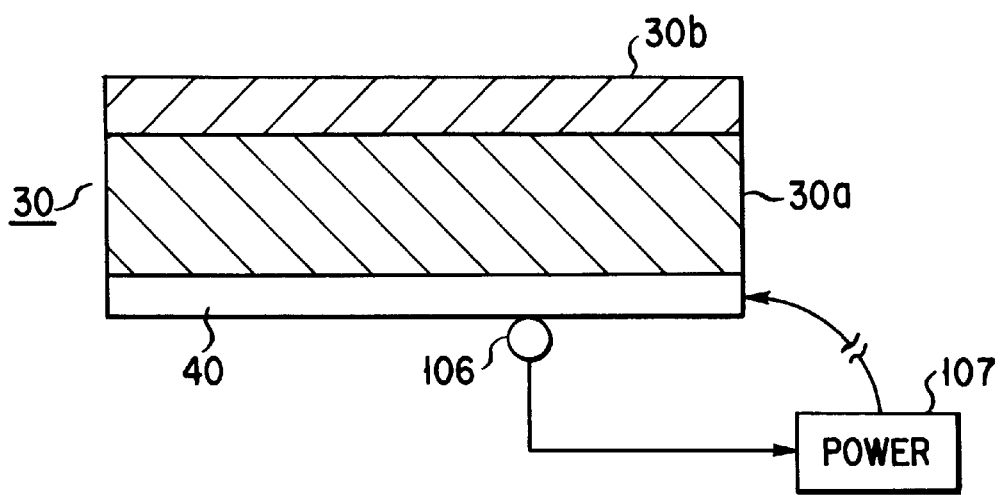
FIG. 4 is a view, useful in explaining an adsorption plate according to the invention and using a precious metal catalyst.

FIG. 3 is a sectional view, showing a portion of the apparatus in the vicinity of the sample chamber shown in FIGS. 1 and 2. As is shown in FIGS. 3 and 4, each catalyst adsorption plate 30 includes a carrier 30a, a precious metal catalyst 30b carried by the carrier, and an electric heater 40 for heating the plate. The electric heater 40 contains a temperature sensor 106 used to keep the temperature at a constant value (e.g. 100° C.). In response to the sensing results of the sensor 106, a power supply 107 is automatically turned on and off to prevent the electron beam exposure apparatus from having an excessively high temperature, and hence to prevent degradation of the functions of the electron beam exposure apparatus due to thermal expansion.

A gas inlet port 31a is connected to the sample chamber 19 for introducing therein oxygen supplied from an oxygen gas cylinder 34a through a supply gate valve 35a. A shut-off gate vale 32a is interposed between the sample chamber 19 and the beam column 11. The shut-off valve 32a is closed while oxygen gas is supplied into the sample chamber 19, to prevent oxygen from flowing into the beam column 11, in particular into the electron gun chamber 202.

A gas exhaustion port 33a is connected to the sample chamber 19 for exhausting gas from the chamber 19 through an exhaustion gate valve 36a to a vacuum pump 23a. The vacuum pump 23a the exhaustion gate valve 36a and the gas exhaustion port 33a may be replaced with a standard unit for exhausting the sample chamber 19.

As is shown in FIG. 4, in the catalyst adsorption plate 30, the carrier 30a carries a porous platinum layer 30b formed of, for example, platinum sponge, platinum black, etc. The adsorption plate 30 can be formed by, for example, depositing platinum on a titanium carrier under a vacuum pressure. If Ar gas is introduced into a deposition container during deposition, and the internal pressure is kept at, for example, $1.3 \times 10^{-1}$–1.3 Pa, a porous platinum thin film can be formed.

After the electron beam exposure apparatus is operated for a while, a carbon compound gas is generated from, for example, a resist which comprises a usual high-polymer organic compound and an organic solvent, and is adsorbed on the catalyst adsorption plate 30. Then, the shut-off gate valve 32 is closed, oxygen gas is supplied into the sample chamber 19, and the carbon compound gas adsorbed on the catalyst adsorption plate 30 is oxidized and decomposed. The electric heater 40 heats the catalyst adsorption plate 30 to accelerate the decomposition by oxidation. Substances such as $CO_2$, $H_2O$, etc. obtained after the carbon compounds are decomposed by oxidation are exhausted to the outside of the sample chamber 19 through the vacuum pump 23 connected thereto. In this embodiment, the catalyst adsorption plate 30 is located near the shut-off gate valve 32a and close to a position in which carbon compounds are formed, in order to effectively adsorb the carbon compounds.

The catalyst adsorption plate 30 of FIG. 4 may be formed of three kinds of substances as described below.

First, a case where only porous platinum is used is considered. Since in this case, platinum itself is porous, a platinum layer has a large surface area. As a result, the platinum layer has a high carbon compound adsorption effect and decomposition-by-oxidation effect.

Second, a case is considered where the carrier 30a which carries a catalyst is formed of a porous substance such as zeolite, activated carbon, porous carbon, porous silicon carbide, etc., and a platinum layer is provided thereon. Since in this case, the carrier 30a is a porous substance, the platinum layer formed thereon has a large surface area and hence has a high adsorption effect and decomposition-by-oxidation effect.

Third, a case is considered where the carrier 30a is formed of a porous substance such as zeolite, activated carbon, porous carbon, porous silicon carbide, etc., and platinum particles are provided thereon. Also in this case, the carrier 30a is a porous substance, and the overall surface of the platinum particles has a large area and hence has a high adsorption effect and decomposition-by-oxidation effect.

Methods for making the carrier 30a carry a catalyst include an impregnation method, a spray method, a mixing method, etc., which use a chloride or nitride of the catalyst. In the impregnation method, for example, the carrier 30a is impregnated in a platinum chloride, then extra solution on the carrier is blown by air blow, and the resultant product is sintered. As a result, fine particles of platinum/oxidized-platinum are carried by the carrier.

If in the catalyst adsorption plate 30 of the first embodiment, an oxygen-occluding substance 30c capable of occluding oxygen is used as an auxiliary catalyst as shown in FIG. 5, carbon compounds can be decomposed by oxidation without introducing oxygen. Cerium oxide, for example, can be used as the oxygen-occluding substance 30c. To make the carrier 30a carry cerium oxide, the carrier is soaked in a cerium nitrate solution, then dried to evaporate moisture therein and sintered. The carrier with cerium oxide is soaked in a platinum chloride (or platinum nitrate) solution, then has its extra solution removed, and is sintered. As a result, a product consisting of the carrier 30a, and cerium oxide and platinum provided thereon is obtained.

Cerium oxide and platinum may be provided on the carrier in the form of layers as shown in FIG. 5, or in the form of a single layer. Cerium oxide supplies oxygen necessary for oxidation of carbon compounds by emitting oxygen occluded therein.

In this method, carbon compounds are decomposed by oxidation while cerium oxide emits oxygen. Since, therefore, it is not necessary to introduce oxygen during the time, the electron beam exposure apparatus can be used longer than in the first embodiment.

A second embodiment of the invention will now be described in detail with reference to the drawings related thereto.

FIG. 6 is a schematic sectional view, showing an electron beam exposure apparatus equipped with deflector electrodes 210. Each deflector electrode 210 carries, on its inner surface, a precious metal catalyst layer 211 which has a function of catalysis, and, on its outer surface, an electric heater 212 as used in the first embodiment for heating the deflector electrode, as is shown in FIG. 7.

A gas inlet port 31b is connected to a portion of the apparatus just below the first shaping aperture 18-1. Through the gas inlet port 31b, oxygen gas, ozone gas, halogen gas, etc. can be supplied into the apparatus.

A shut-off gate valve 32b is interposed between the electron gun chamber 202 and the other components of the beam column 11. The shut-off valve 32b is closed while gas is supplied into the beam column 11, thereby preventing an oxidizing gas from flowing into the electron gun chamber 202. A gas exhaust port 33b is connected to a portion of the apparatus just above the second shaping aperture 18-2.

Figure 7:
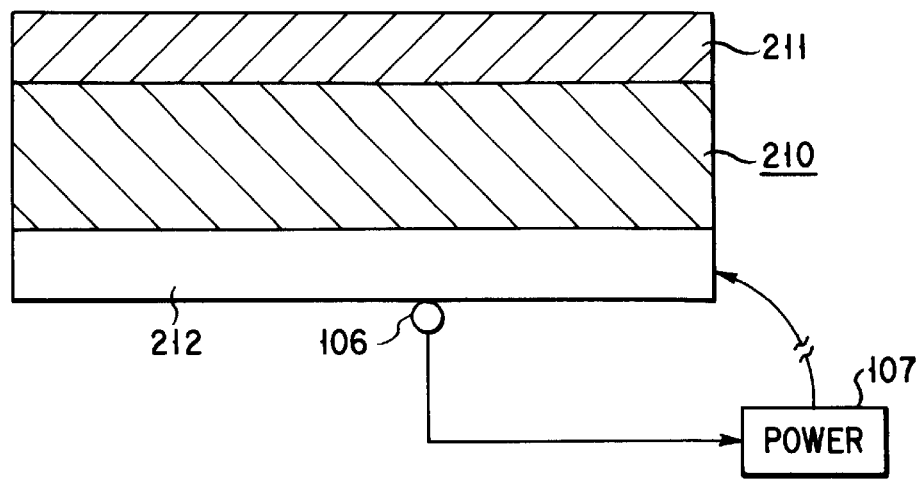
FIG. 7 is a view, useful in explaining a deflector electrode having a precious metal catalyst layer according to the invention.

Porous platinum as a precious metal catalyst, such as platinum sponge or platinum b lack, is provided on the inner surface of the deflector electrode 210, as is shown in FIG. 7. The deflector electrode 210 is formed by, for example, depositing platinum on a titanium carrier under a vacuum pressure. During the deposition, argon gas is introduced into the deposition container, and the pressure therein is kept at $1.3 \times 10^{-1}$–1.3 Pa. As a result, a porous platinum thin film is formed.

After the electron beam exposure apparatus is operated for a while, a carbon compound gas generated from, for example, a resist as a usually-used high-polymer organic solvent is absorbed on the catalyst layer of the deflector electrodes 210. At this time, the shut-off valve 32b is closed, thereby supplying oxygen gas into the beam column 11 to decompose, by oxidation, the carbon compound gas absorbed on the catalyst layer of the electrodes 210. The decomposition by oxidation can be accelerated by heating the deflector electrodes 210 using the electric heaters 212. $CO_2$, $H_2O$, etc. resulting from the decomposition of the carbon compounds are exhausted to the outside of the beam column 11 through the gas exhaustion port 33b.

Figure 8:
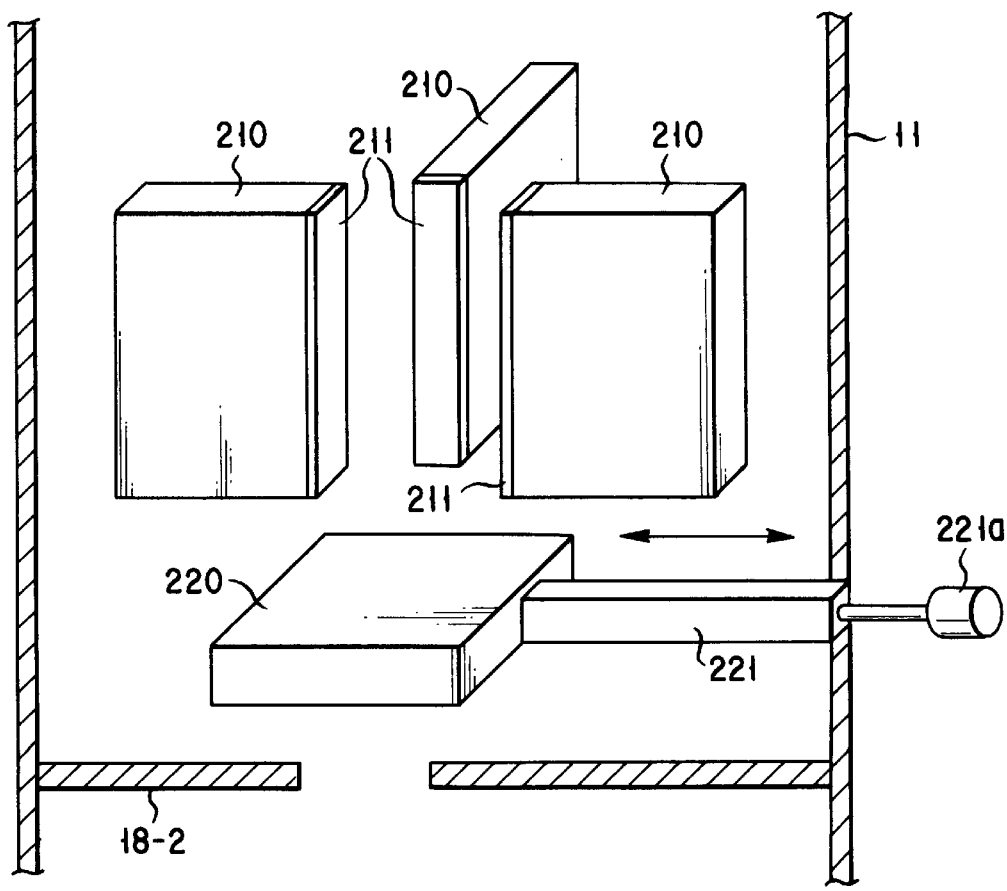
FIG. 8 is a view, showing an electron beam exposure apparatus provided with deflector electrodes each having a precious metal catalyst layer according to the invention, and light emission means for radiating the deflector electrodes.

FIG. 8 schematically shows a modification of the second embodiment of the invention. In this modification, an emission unit 220 such as a ultraviolet lamp is provided, instead of the electric heater 212 employed in the second embodiment, in the beam column 11 between the deflector electrodes 210 and the second shaping aperture 18-2. The emission unit 220 is usually located at a corner of the barrel 11 so that it will not interrupt the beam.

When an oxidizing gas is introduced into the beam column 11, the emission unit 220 is moved to the center of the barrel 11 by extending emission unit displacing means 221 in a direction indicated by the arrow, using, for example, a driving motor 221a located outside the barrel 11. In this position, the emission unit 220 emits light onto the deflector electrodes 210. The energy of the emission further accelerates decomposition of carbon compounds by oxidation using a catalyst.

Figure 9:
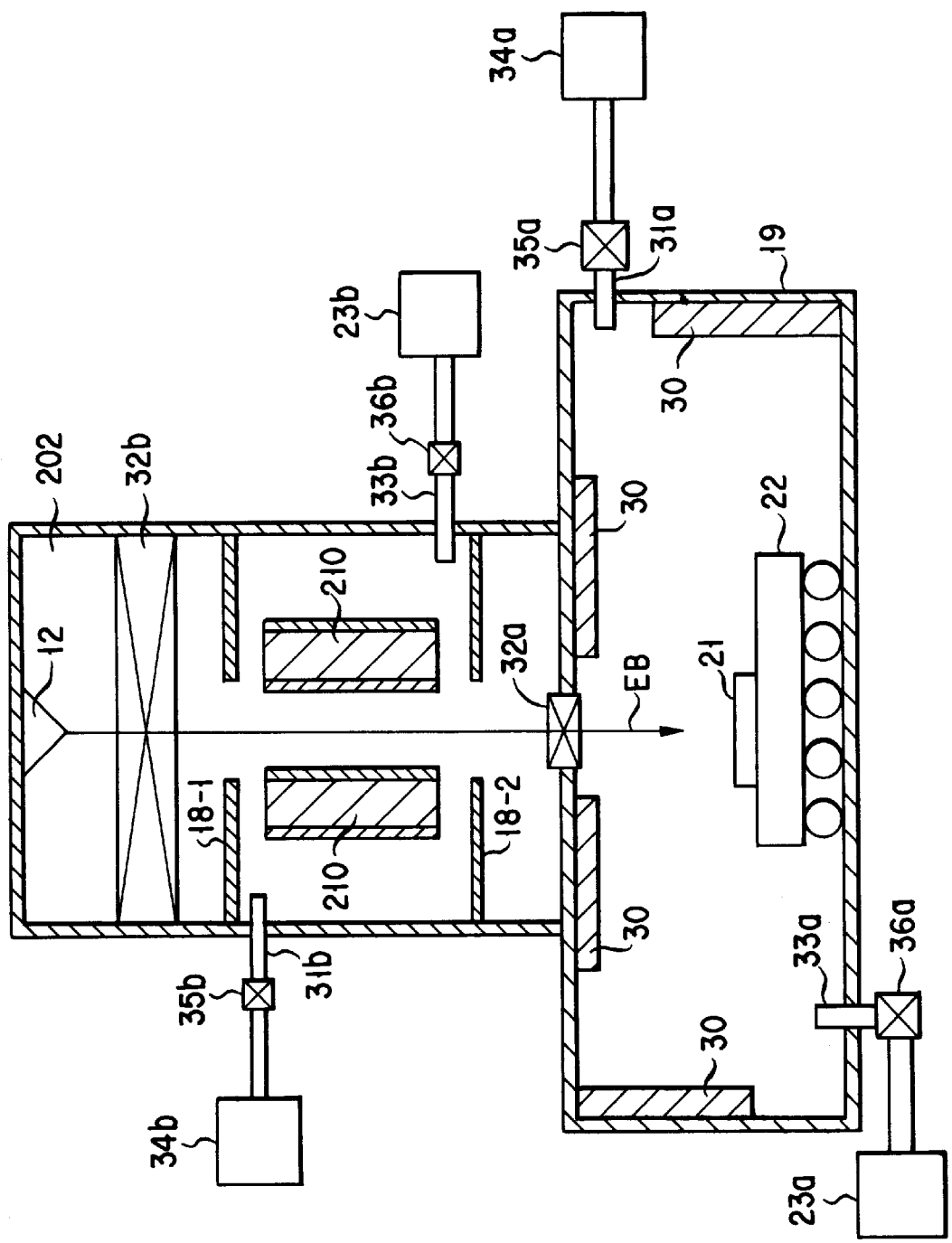
FIG. 9 is a sectional view, showing an electron beam exposure apparatus according to a third embodiment of the invention.

Referring then to FIG. 9, a third embodiment of the invention will be described in detail.

FIG. 9 is a schematic sectional view, illustrating an electron beam exposure apparatus equipped with deflector electrodes 210 and catalyst adsorption plates 30. As is shown in FIG. 7, each deflector electrode 210 carries, on its inner surface, a precious metal catalyst layer 211 which has a function of catalysis, and, on its outer surface, an electric heater 212 as used in the first embodiment for heating the deflector electrode, as is shown in FIG. 7.

Each catalyst adsorption plate 30 is attached to a corresponding wall portion of the sample chamber 19. As shown in FIG. 4, an electric heater 40 is attached to each catalyst adsorption plate 30 for heating the plate.

Gas inlet ports 31 are connected to the beam column 11 and the sample chamber 19, through which ports oxygen gas, ozone gas, halogen gas, etc. can be supplied into the apparatus. Moreover, a shut-off gate valve 32b is interposed between the electron gun chamber 202 and the other components of the beam column 11. The shut-off valve 32b is closed while gas is supplied into the beam column 11, thereby preventing an oxidizing gas from flowing into the electron gun chamber 202. Vacuum pumps 23 are connected to the beam column 11 and the sample chamber 19.

As aforementioned, the precious metal catalyst layer 211 formed of porous platinum such as platinum sponge or platinum black, is provided on the inner surface of each deflector electrode 210. The deflector electrode 210 is formed by, for example, depositing platinum on a titanium carrier under a vacuum pressure. During the deposition, argon gas is introduced into the deposition container, and the pressure therein is kept at $1.3 \times 10^{-1}$–1.3 Pa. As a result, a porous platinum thin film is formed.

After the electron beam exposure apparatus is operated for a while, a carbon compound gas generated from, for example, a resist as a usually-used high-polymer organic solvent is adsorbed on the catalyst layer of the deflector electrodes 210. At this time, the shut-off valve 32b is closed, thereby supplying oxygen gas into the beam column 11 to decompose, by oxidation, the carbon compound gas adsorbed on the catalyst layer of the electrodes 210. The decomposition by oxidation can be accelerated by heating the deflector electrodes 210 using the electric heaters 212.

$CO_2$, $H_2O$, etc. resulting from the decomposition of the carbon compounds are exhausted to the outside of the beam column 11 and the sample chamber 19 by the vacuum pumps 23 connected thereto.

This embodiment can be formed of modifications of the first and second embodiments.

The electron beam exposure apparatus can be used for a long time without being taken apart by providing catalytic adsorption plates in both the sample chamber and the beam column. Furthermore, the beam column 11 and the sample chamber 19 can be cleaned individually.

Specific embodiments of the invention have been described. However, the invention is not limited to them. For example, the precious metal catalyst may consist of palladium or iridium instead of platinum, or of an alloy which contains at least one of palladium, iridium and platinum. Moreover, the catalyst may consist of, instead of porous platinum, platinum sponge, platinum black, porous palladium, palladium black or porous iridium, or of an alloy which contains at least one of porous platinum, platinum sponge, platinum black, porous palladium, palladium black and porous iridium.

In addition, the invention is applicable to, as well as the above-described electron beam exposure apparatus, an electron beam exposure apparatus such as an SEM (Scanning Electron Microscope), an ion beam apparatus such as an FIB (Focused Ion Beam), etc., without departing from its scope. In the case of the SEM, the invention can enhance its resolution and stability. In the case of the FIB, it can enhance the radiation accuracy and stability.

Since the electron beam exposure apparatus of the invention can reduce the amount of, for example, carbon compounds, beam drift which will occur when carbon compounds accumulated on deflector electrodes are charged up can be suppressed. Accordingly, degradation of drawing accuracy due to the beam drift can be minimized.

Also, carbon compounds adsorbed on a precious metal catalyst can be decomposed and removed by oxidation by introducing oxygen into the charged-particle beam apparatus. This means that the accumulated carbon compounds can be removed without taking apart the apparatus, and hence that the apparatus can be efficiently operated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged-particle beam apparatus comprising:
   a beam column having a beam source section which contains a beam source for generating a charged-particle beam, and a deflector electrode section for deflecting the beam generated from the beam source;
   a chamber connected to the beam column; and
   a catalyst member provided in an area of the at least one of the beam column and the sample chamber, in which carbon compounds are generated, the catalytic material accelerating decomposition of the carbon compounds by oxidation.

2. A charged-particle beam apparatus according to claim 1, wherein the catalyst member includes an adsorption plate which consists of a carrier and a precious metal carried by the carrier.

3. A charged-particle beam apparatus according to claim 2, wherein the precious metal is at least one selected from the group consisting of platinum, palladium, iridium and an alloy containing at least one of platinum, palladium and iridium.

4. A charged-particle beam apparatus according to claim 2, wherein the precious metal is at least one selected from the group consisting of platinum sponge, platinum black, porous platinum, porous palladium, palladium black, porous iridium, and an alloy containing at least one of platinum sponge, platinum black, porous platinum, porous palladium, palladium black and porous iridium.

5. A charged-particle beam apparatus according to claim 2, wherein the catalyst member further includes an auxiliary catalyst which has an oxygen occluding function.

6. A charged-particle beam apparatus according to claim 2, wherein the catalyst member further includes means for heating the precious metal to accelerate decomposition of the carbon compounds by oxidation.

7. A charged-particle beam apparatus according to claim 2, wherein the catalyst member further includes means for applying light to the precious metal to accelerate decomposition of the carbon compounds by oxidation.

8. A charged-particle beam apparatus according to claim 1, further comprising separation means for separating the beam source section from the beam column.

9. A charged-particle beam apparatus according to claim 1, further comprising separation means for separating the beam column from the sample chamber.

10. A charged-particle beam apparatus according to claim 1, further comprising means for supplying an oxidizing gas into at least one of the beam column and the sample chamber, and exhausting the at least one of the beam column and the sample chamber.

11. A charged-particle beam apparatus according to claim 1, wherein the deflector electrode section has another catalyst member.

12. A charged-particle beam apparatus according to claim 11, wherein the catalyst member of the deflector electrode section has a carrier and a precious metal carried by the carrier, the precious metal being at least one selected from the group consisting of platinum, palladium, iridium and an alloy containing at least one of platinum, palladium and iridium.

13. A charged-particle beam apparatus according to claim 11, wherein the precious metal of the catalyst member of the deflector electrode section is at least one selected from the group consisting of platinum sponge, platinum black, porous platinum, porous palladium, palladium black, porous iridium, and an alloy containing at least one of platinum sponge, platinum black, porous platinum, porous palladium, palladium black and porous iridium.

14. A charged-particle beam apparatus according to claim 11, wherein the catalyst member of the deflector electrode section further includes means for heating the precious metal to accelerate decomposition of the carbon compounds by oxidation.

15. A charged-particle beam apparatus according to claim 11, wherein the catalyst member of the deflector electrode section further includes means for applying light to the precious metal to accelerate decomposition of the carbon compounds by oxidation.

16. A charged-particle beam apparatus including: a beam column having a beam source section which contains a beam source for generating a charged-particle beam, and a deflector electrode section for deflecting the beam generated from the beam source; and a sample chamber connected to the beam column and containing a sample to be radiated with the beam deflected by the deflector electrode section of the beam column; wherein the deflector electrode section has a catalyst member consisting of a carrier and a precious metal carried by the carrier.

17. A charged-particle beam apparatus according to claim 16, wherein the precious metal is at least one selected from the group consisting of platinum, palladium, iridium and an alloy containing at least one of platinum, palladium and iridium.

18. A charged-particle beam apparatus according to claim 16, wherein the precious metal is at least one selected from the group consisting of platinum sponge, platinum black, porous platinum, porous palladium, palladium black, porous iridium, and an alloy containing at least one of platinum sponge, platinum black, porous platinum, porous palladium, palladium black and porous iridium.

19. A charged-particle beam apparatus according to claim 16, wherein the catalyst member further includes means for heating the precious metal to accelerate decomposition of the carbon compounds by oxidation.

20. A charged-particle beam apparatus according to claim 16, wherein the catalyst member further includes means for applying light to the precious metal to accelerate decomposition of the carbon compounds by oxidation.

21. A charged-particle beam apparatus according to claim 16, further comprising separation means for separating the beam source section from the beam column.

22. A charged-particle beam apparatus according to claim 16, further comprising separation means for separating the beam column from the sample chamber.

23. A charged-particle beam apparatus according to claim 16, further comprising means for supplying an oxidizing gas into at least one of the beam column and the sample chamber, and exhausting the at least one of the beam column and the sample chamber.

* * * * *